(12) United States Patent
Xiao et al.

(10) Patent No.: US 11,569,303 B2
(45) Date of Patent: Jan. 31, 2023

(54) PIXEL ARRANGEMENT STRUCTURE OF DISPLAY PANEL AND DISPLAY APPARATUS

(71) Applicant: YUNGU (GU'AN) TECHNOLOGY CO., LTD., Hebei (CN)

(72) Inventors: Zhihui Xiao, Kunshan (CN); Junjie Huang, Kunshan (CN); Ping Song, Kunshan (CN); Weijian Shan, Kunshan (CN); Yaling Wang, Kunshan (CN); Zhiye Yang, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 8 days.

(21) Appl. No.: 16/941,984

(22) Filed: Jul. 29, 2020

(65) Prior Publication Data
US 2020/0357864 A1 Nov. 12, 2020

Related U.S. Application Data

(63) Continuation of application No. PCT/CN2019/089084, filed on May 29, 2019.

(30) Foreign Application Priority Data

Nov. 29, 2018 (CN) .......................... 201811442691.5

(51) Int. Cl.
*H01L 27/32* (2006.01)
(52) U.S. Cl.
CPC ...... *H01L 27/3218* (2013.01); *H01L 27/3216* (2013.01)

(58) Field of Classification Search
CPC . H01L 27/32; H01L 27/3216; H01L 27/3218; H01L 51/56; G09G 3/2003
See application file for complete search history.

(56) References Cited

U.S. PATENT DOCUMENTS

| 2013/0234917 | A1 | 9/2013 | Lee |
| 2014/0042887 | A1 | 2/2014 | Ko |
| 2016/0240592 | A1* | 8/2016 | Li ........................ H01L 27/3218 |

(Continued)

FOREIGN PATENT DOCUMENTS

| CN | 103311266 A | 9/2013 |
| CN | 103681754 A | 3/2014 |

(Continued)

OTHER PUBLICATIONS

Examination Report dated Mar. 25, 2020 of corresponding Chinese application No. 201811442691.5; 6 pages.

(Continued)

*Primary Examiner* — Eric K Ashbahian
(74) *Attorney, Agent, or Firm* — Maier & Maier, PLLC

(57) ABSTRACT

A pixel arrangement structure of display panel and a display apparatus, which are used to solve the technical problem of low pixel aperture ratio of an organic light emitting diode display panel. Herein, a pixel arrangement structure of display panel includes: a plurality of sub-pixels including a first sub-pixel, a second sub-pixel, and a third sub-pixel; where the first sub-pixel, the second sub-pixel, and the third sub-pixel have a polygonal structure with different numbers of sides, and distances between any adjacent two of the plurality of sub-pixels are equal.

15 Claims, 6 Drawing Sheets

(56) References Cited

U.S. PATENT DOCUMENTS

| | | | | |
|---|---|---|---|---|
| 2020/0258441 A1* | 8/2020 | Zhang | ................ | H01L 27/3218 |
| 2020/0273924 A1* | 8/2020 | Xiao | ................... | H01L 27/3218 |
| 2020/0357862 A1* | 11/2020 | Wang | ................ | H01L 27/3218 |

FOREIGN PATENT DOCUMENTS

| | | | |
|---|---|---|---|
| CN | 104037200 | A | 9/2014 |
| CN | 104362170 | A | 2/2015 |
| CN | 204391118 | U | 6/2015 |
| CN | 208077981 | U | 11/2018 |
| CN | 109037287 | A | 12/2018 |
| CN | 109585508 | A | 4/2019 |
| TW | 201635514 | A | 10/2016 |
| WO | 2018084215 | A1 | 5/2018 |

OTHER PUBLICATIONS

International Search Report dated Jul. 17, 2019 in corresponding International application No. PCT/CN2019/089084; 4 pages.
Examination Report dated Feb. 21, 2020 of corresponding Taiwanese application No. 108120475; 4 pages.

* cited by examiner

PIXEL ARRANGEMENT STRUCTURE OF DISPLAY PANEL AND DISPLAY APPARATUS

CROSS-REFERENCE TO RELATED DISCLOSURES

This application is a continuation of International Application No. PCT/CN2019/089084, filed on May 29, 2019, which claims priority to Chinese Patent Application No. 201811442691.5, filed on Nov. 29, 2018, both of which are hereby incorporated by reference in their entireties.

FIELD

The present disclosure relates to the field of display technology and, in particular, to a pixel arrangement structure of display panel and a display apparatus.

BACKGROUND

Organic light emitting diode (OLED for short), as a current-type light emitting device, is more and more used in high-performance display fields such as flexible display panels, because of its many characteristics such as self-luminescence, fast response, wide viewing angle, and fabrication on flexible substrate. OLED materials realize RGB (red, green and blue) display through thermal evaporation of organic materials, which requires a mask to block. This also makes the OLED pixel arrangement restricted by the mask, and the display aperture ratio will also be restricted.

In the prior art, a pixel of the three primary colors is designed into a rectangular structure to improve the aperture ratio of pixel. Here, the pixel unit combination formed with arranged pixel of three primary colors presents a rectangular structure, and the pixels of each color in the combination of pixel units also present a rectangular structure.

The pixel with three rectangular structures will increase the area of the spacing region between the arranged pixels, thereby compressing the display area of the pixel and reducing the aperture ratio of the pixel.

SUMMARY

In view of the above defects, the present disclosure provides a pixel arrangement structure of display panel and a display apparatus, which are used to solve the technical problem of low pixel aperture ratio of an organic light emitting diode display panel.

In a first aspect, the present disclosure provides a pixel arrangement structure of display panel, including: a plurality of sub-pixels including a first sub-pixel, a second sub-pixel and third sub-pixel, where the first sub-pixel, the second sub-pixel and the third sub-pixel have a polygonal structure with different numbers of sides, and distances between any adjacent two of the plurality of sub-pixels are equal.

A second aspect of the present disclosure provides a display apparatus, including: the pixel arrangement structure of display panel according to any one of the first aspect.

The present disclosure provides a pixel arrangement structure of display panel and a display apparatus, where the pixel arrangement structure of display panel includes: a plurality of sub-pixels including a first sub-pixel, a second sub-pixel and a third sub-pixel, where the first sub-pixel, the second sub-pixel and the third sub-pixel have a polygonal structure with different numbers of sides, and distances between any adjacent two of the plurality of sub-pixels are equal. Since the first sub-pixel, the second sub-pixel and the third sub-pixel have different polygonal structures, the distances between any two of the first sub-pixel, the second sub-pixel and the third sub-pixel, which that are adjacent to each other, may be set to equal when arranging, so that all pixels are arranged in a regular matrix, therefore, the manufacturing accuracy of the sub-pixel light emitting material pattern can be effectively improved, and the wrinkles produced by the mask during stretching can be reduced. In addition, the first sub-pixel, the second sub-pixel and the third sub-pixel with different polygonal structures can increase display area of pixels and improve the aperture ratio of pixels.

DETAILED DESCRIPTION

The technical solutions in the embodiments of the present disclosure will be described clearly and completely in combination with the drawings in the embodiments of the present disclosure.

In the case of no conflict, the following embodiments and the features in the embodiments can be combined with each other.

Figure 1:
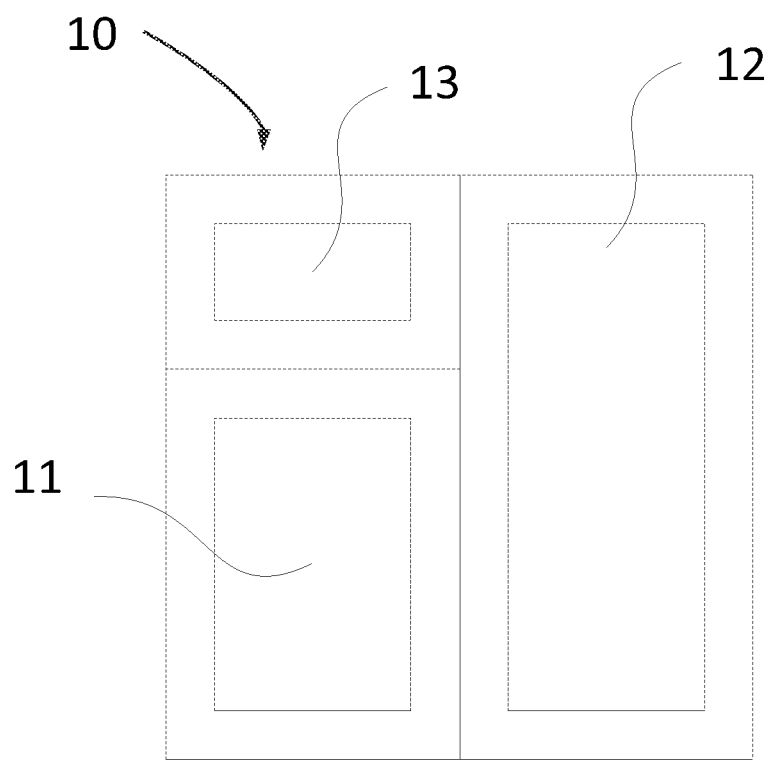
FIG. 1 of the present disclosure is a structural schematic diagram of a pixel arrangement structure of an existing display panel.

FIG. 1 is a schematic structural diagram of a pixel arrangement structure of a conventional display panel, as shown in FIG. 1, including: a first sub-pixel 11, a second sub-pixel 12, and a third sub-pixel 13; where the first sub-pixel 11, the second sub-pixel 12, and the third sub-pixel 13 all have rectangular structures, and the pixel unit combination 10 composed of the first sub-pixel 11, the second sub-pixel 12, and the third sub-pixel 13 also has a rectangular structure.

Referring to FIG. 1, for convenience of description, an inner side of the rectangular structure of the first sub-pixel 11, the second sub-pixel 12, and the third sub-pixel 13 is called a pixel side, and an outer side of the rectangular structure of the first sub-pixel 11, the second sub-pixel 12, and the third sub-pixel 13 is called a reserved side (that is, an edge of the mask formed in the mask process). The reserved sides of each sub-pixel constitute an outside edge of the sub-pixel, and the pixel sides of each sub-pixel constitute an inner edge of the sub-pixel. The area between the pixel side and the reserved side constitutes space region between the pixel openings, and the space region will compress display area of the pixel, thereby reducing the pixel aperture ratio.

In the pixel arrangement structure in FIG. 1, since the first sub-pixel 11, the second sub-pixel 12, and the third sub-pixel 13 all have rectangular structures, there is a problem that the area of the space region between the pixel openings is large and the pixel aperture ratio is low, which limits the improvement of the photoelectric performance of the organic light emitting diode.

In view of the above problems, the present disclosure aims to provide a pixel arrangement structure of display panel and a display apparatus, so as to improve the pixel aperture ratio of an organic light emitting diode display panel.

Figure 2:
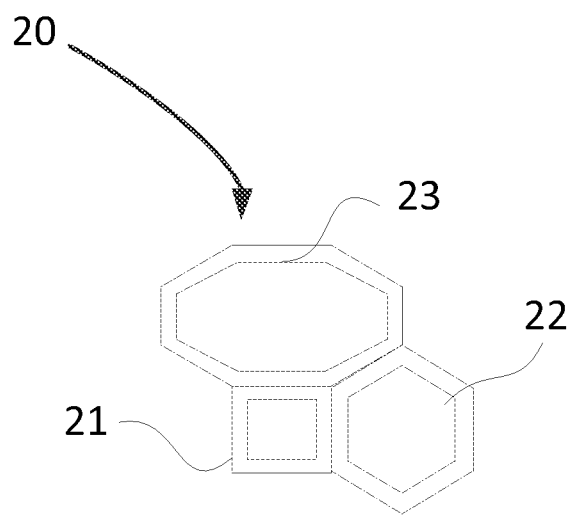
FIG. 2 is a schematic structural diagram of a pixel arrangement structure of display panel according to a first embodiment of the present disclosure.

FIG. 2 is a schematic structural diagram of a pixel arrangement structure of display panel according to a first embodiment of the present disclosure. As shown in FIG. 2, the pixel arrangement structure of this embodiment includes: a first sub-pixel 21, a second sub-pixel 22, and a third sub-pixel 23, where the first sub-pixel 21, the second sub-pixel 22, and the third sub-pixel 23 have polygonal structures with different numbers of sides, and the distances between adjacent sides of the first sub-pixel 21, the second sub-pixel 22, and the third sub-pixel 23 are equal.

In one embodiment, the first sub-pixel 21, the second sub-pixel 22, and the third sub-pixel 23 have a square structure, a regular hexagon structure, and a non-regular octagonal structure, respectively.

Optionally, the distances from pixel sides to the respective reserved sides of the first sub-pixel 21, the second sub-pixel 22, and the third sub-pixel 23 are all equal. For convenience of description, the inner side of the polygonal structure of the first sub-pixel 21, the second sub-pixel 22, and the third sub-pixel 23 is called a pixel side, and the outer side of the polygonal structure of the first sub-pixel 21, the second sub-pixel 22, and the third sub-pixel 23 is called a reserved side. The reserved side refers to an outer boundary of the pixel when shielded by a mask structure.

In this embodiment, the distances from pixel sides to the respective reserved sides of the first sub-pixel 21, the second sub-pixel 22, and the third sub-pixel 23 are set to be equal, so as to make the final pixel arrangement structure present as a regular matrix arrangement. That is, there is no misalignment between sub-pixels of the same type, which can effectively improve the manufacturing accuracy and yield of the sub-pixel light-emitting material pattern, and reduce the risk of wrinkles produced by the mask during stretching. (Referring to FIG. 3, all first sub-pixels are arranged regularly, and there is no misalignment between the first sub-pixels; all second sub-pixels are arranged regularly, and there is no misalignment between the second sub-pixels; all third sub-pixels are arranged regularly, and there is no misalignment between the third sub-pixels). Therefore, the manufacturing accuracy and yield of the sub-pixel light-emitting material pattern can be effectively improved, and the risk of wrinkles generated when mask opens the net is reduced.

Referring to FIG. 2, the first sub-pixel 21 may be set as a rectangular structure; the second sub-pixel 22 may be set as a hexagonal structure; and the third sub-pixel 23 may be set as an octagonal structure. Here, the first sub-pixel 21, the second sub-pixel 22, and the third sub-pixel 23 that are adjacent to each other constitute a pixel unit combination 20, and the colors of the first sub-pixel 21, the second sub-pixel 22, and the third sub-pixel 23 in the pixel unit combination 20 are different.

The colors in the pixel unit combination 20 include: red, blue, and green.

In the pixel unit combination 20, the first sub-pixel may be set to R (red), the second sub-pixel may be set to G (green) or B (blue), and the third sub-pixel may be set to B (blue) or G (green).

In the pixel unit combination 20, the first sub-pixel may be set to G (green), the second sub-pixel may be set to B (blue) or R (red), and the third sub-pixel may be set to R (red) or B (blue).

In this embodiment, a plurality of colors can be displayed by combining three primary colors (RGB) to achieve the effect of color display.

A length of a shortest side among reserved sides of an octagon presented by the third sub-pixel 23 is greater than or equal to 9 um. By defining the length of the shortest side among reserved sides of the octagon presented by the third sub-pixel 23, the ratio of display areas of pixels in different colors can be controlled.

Referring to FIG. 2, there is no gap between reserved sides that are adjacent to each other of the first sub-pixel 21, the second sub-pixel 22, and the third sub-pixel 23 in the pixel unit combination 20. This is to reduce the pixel space as much as possible, so that more pixel unit combinations can be set on a same area.

Figure 3:
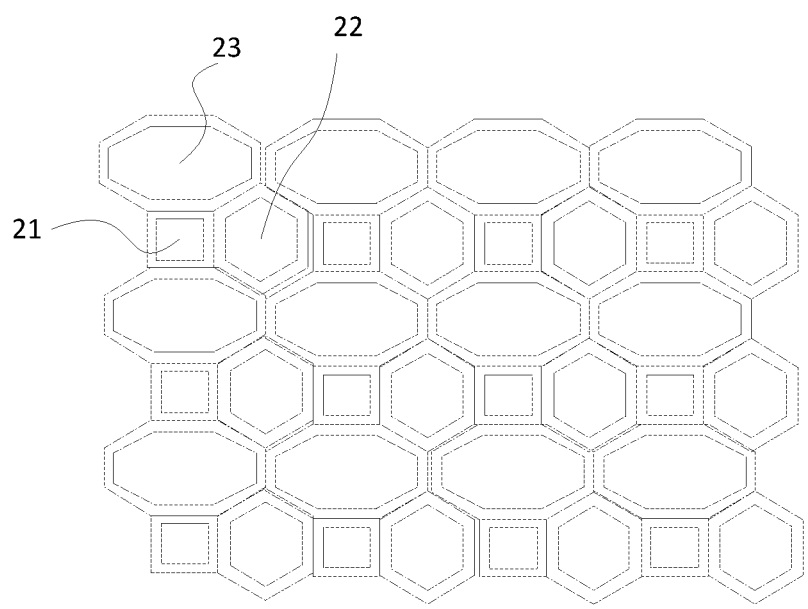
FIG. 3 is a schematic diagram of an overall effect of the pixel arrangement structure of display panel in FIG. 2.

Lengths of reserved sides that are adjacent to each other of the first sub-pixel 21, the second sub-pixel 22, and the third sub-pixel 23 in the pixel unit combination 20 are equal, so to make the final pixel arrangement structure present as a regular matrix arrangement. FIG. 3 is a schematic diagram of an overall effect of the pixel arrangement structure of display panel in FIG. 2. As shown in FIG. 3, the first sub-pixels 21, the second sub-pixels 22, and the third sub-pixels 23 are arranged in a regular matrix. This arrangement can effectively improve the manufacturing accuracy of the sub-pixel luminescent material pattern, and reduce the wrinkles produced by the mask during stretching.

In a first direction, the third sub-pixels are located in odd rows, and the first sub-pixels and the second sub-pixels are alternately arranged in even rows; and in a second direction, the first sub-pixels and the third sub-pixels are alternately arranged in same rows and their central points are on same straight lines, and central points of shortest sides among reserved sides of octagons presented by the third sub-pixels are located on an imaginary line connecting two centers of the vertically arranged second sub-pixels of the plurality of the second sub-pixels; or, In a first direction, the third sub-pixels are located in even rows, and the first and the second sub-pixels are alternately arranged in odd rows; and in a second direction, the first sub-pixels and the third sub-pixels are alternately arranged in same rows and their central points are on same straight lines, and central points of shortest sides among reserved sides of octagons presented by the third sub-pixels are located on an imaginary line connecting two centers of the vertically arranged second sub-pixels of the plurality of the second sub-pixels.

Specifically, as shown in FIG. 3, the first direction is row direction. In the row direction, the third sub-pixels 23 are located in odd rows, that is, the first, third, and fifth row. The first sub-pixels 21 and the second sub-pixels 22 are alternately arranged in even rows, that is, the second, fourth, and sixth row. The second direction is column direction. In the column direction, the first sub-pixels 21 and the third sub-pixels 23 are alternately arranged in same columns and their central points are on same straight lines. Therefore, the manufacturing accuracy and yield of the sub-pixel light-emitting material pattern can be further effectively improved, and the risk of wrinkles produced by the mask during stretching is further reduced.

It should be noted: the directions of a first direction and a second direction are different, that is, the first direction and the second direction can intersect in the same plane, rather than being limited to perpendicular; the first direction and the second direction are not limited to those shown in FIG. 3, where the first direction is row direction and the second direction is column direction, and in other embodiments, it is also possible that the first direction is the column direction and the second direction is the row direction; the arrangement described herein may be a column or row consistent with the first direction and/or the second direction; although FIG. 3 schematically lists six rows and eight columns of sub-pixels, the specific number of rows and columns can be set according to actual needs, and is not limited in this disclosure.

As can be seen from FIG. 3, the first sub-pixel 21, the second sub-pixel 22, and the third sub-pixel 23 are all arranged regularly. Therefore, a regular-shaped mask can be designed during the production process of the sub-pixel light emitting material pattern, thereby improving the manufacturing accuracy of the sub-pixel light-emitting material pattern, and reducing the wrinkles produced by the mask during stretching.

Figure 4:
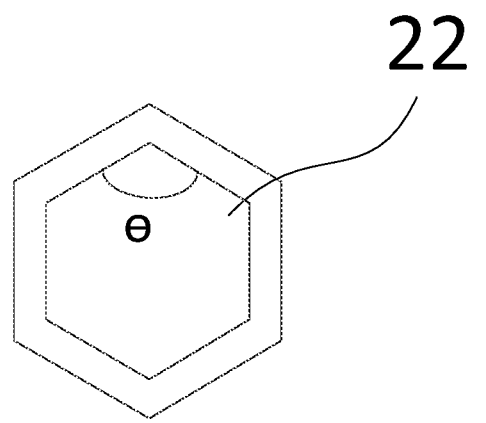
FIG. 4 is a schematic structural diagram of a second sub-pixel.

FIG. 4 is a schematic diagram of a structure of a second sub-pixel. As shown in FIG. 4, the value range of the angle θ of the second sub-pixel 22 is 90 degrees to 180 degrees, that is, the angle between the oblique sides of two adjacent third sub-pixels ranges from 90 degrees to 180 degrees.

This embodiment does not limit the sizes of first sub-pixels, second sub-pixels, and third sub-pixels and the specific size is determined based on the resolution size that can be achieved by the process. By adjusting length of each side of the first sub-pixels, the second sub-pixels, and the third sub-pixels, the aperture ratios of different colors can be adjusted.

In this embodiment, first sub-pixels, second sub-pixels, and third sub-pixels of a display panel are set to different polygonal structures, such as square structure, regular hexagonal structure, and non-regular octagonal structure, respectively. Since the first sub-pixels, the second sub-pixels, and the third sub-pixels have different polygonal structures, the distances between adjacent sides of the first sub-pixel, the second sub-pixel, and the third sub-pixel may be set to equal in the arrangement, so that all pixels are arranged in a regular matrix, thereby effectively improving the manufacturing accuracy of the sub-pixel light emitting material pattern, and reducing the wrinkles produced by mask during stretching. In addition, the first sub-pixel, the second sub-pixel and the third sub-pixel with different polygonal structures can effectively increase display area of pixels and improve an aperture ratio of pixels.

Figure 5:
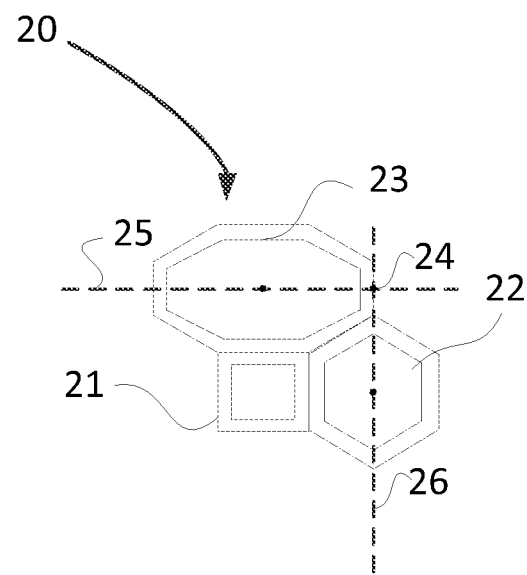
FIG. 5 is a schematic structural diagram of a pixel arrangement structure of display panel according to a second embodiment of the present disclosure.

FIG. 5 is a schematic structural diagram of a pixel arrangement structure of display panel according to a second embodiment of the present disclosure. As shown in FIG. 5, the pixel arrangement structure of this embodiment includes: a first sub-pixel 21 with a rectangular structure, a second sub-pixel 22 with a hexagonal structure, and a third sub-pixel 23 with an octagonal structure, where the distances between adjacent sides of the first sub-pixel 21, the second sub-pixel 22, and the third sub-pixel 23 are equal, and the first sub-pixels 21, the second sub-pixel 22, and the third sub-pixel 23 that are adjacent to each other constitute a pixel unit combination 20. In the pixel unit combination 20, the central point 24 of a shortest side among reserved sides of an octagon presented by the third sub-pixel 23 coincides with a position of an intersection of a vertical central axis 26 of the second sub-pixel and a horizontal central axis 25 of the third sub-pixel.

By controlling the central point 24 of the shortest side among reserved sides of the octagon presented by the third sub-pixel 23 in the pixel unit combination 20 to coincide with the position of the intersection of the vertical central axis 25 of the second sub-pixel and the horizontal central axis 26 of the third sub-pixel, the arrangement of pixels can be made more regular, and the display area ratio of the sub-pixels of three different colors can be balanced, and the aperture ratio of the pixels is improved while ensuring the display effect of the display panel.

The first sub-pixels, second sub-pixels, and third sub-pixels of a display panel are set to different polygonal structures, such as square structure, regular hexagonal structure, and non-regular octagonal structure, respectively. Since the first sub-pixels, the second sub-pixels, and the third sub-pixels have different polygonal structures, the distances between adjacent sides of the first sub-pixel, the second sub-pixel, and the third sub-pixel may be set to equal in the arrangement, so that all pixels are arranged in a regular matrix, thereby effectively improving the manufacturing accuracy of the sub-pixel light emitting material pattern, and reducing the wrinkles produced by mask during stretching. In addition, the first sub-pixel, the second sub-pixel and the third sub-pixel with different polygonal structures can effectively increase display area of pixels and improve an aperture ratio of pixels.

This embodiment does not limit the sizes of first sub-pixels, second sub-pixels, and third sub-pixels and the specific size is determined based on the resolution size that can be achieved by the process. By adjusting length of each side of the first sub-pixels, the second sub-pixels, and the third sub-pixels, the aperture ratios of different colors can be adjusted.

Figure 6:
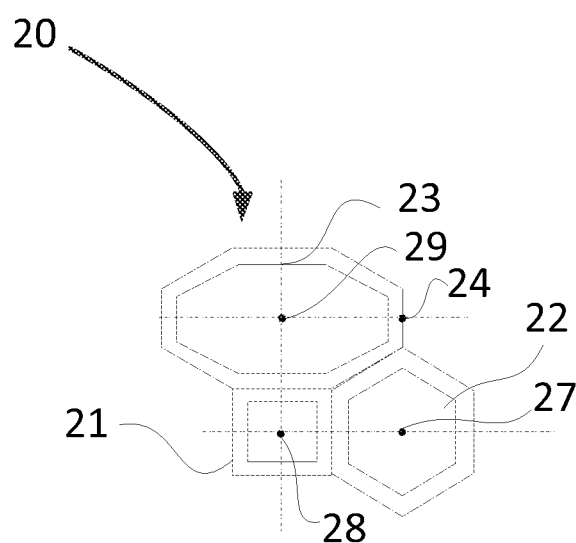
FIG. 6 is a schematic structural diagram of a pixel arrangement structure of display panel according to a third embodiment of the present disclosure.
Figure 7:
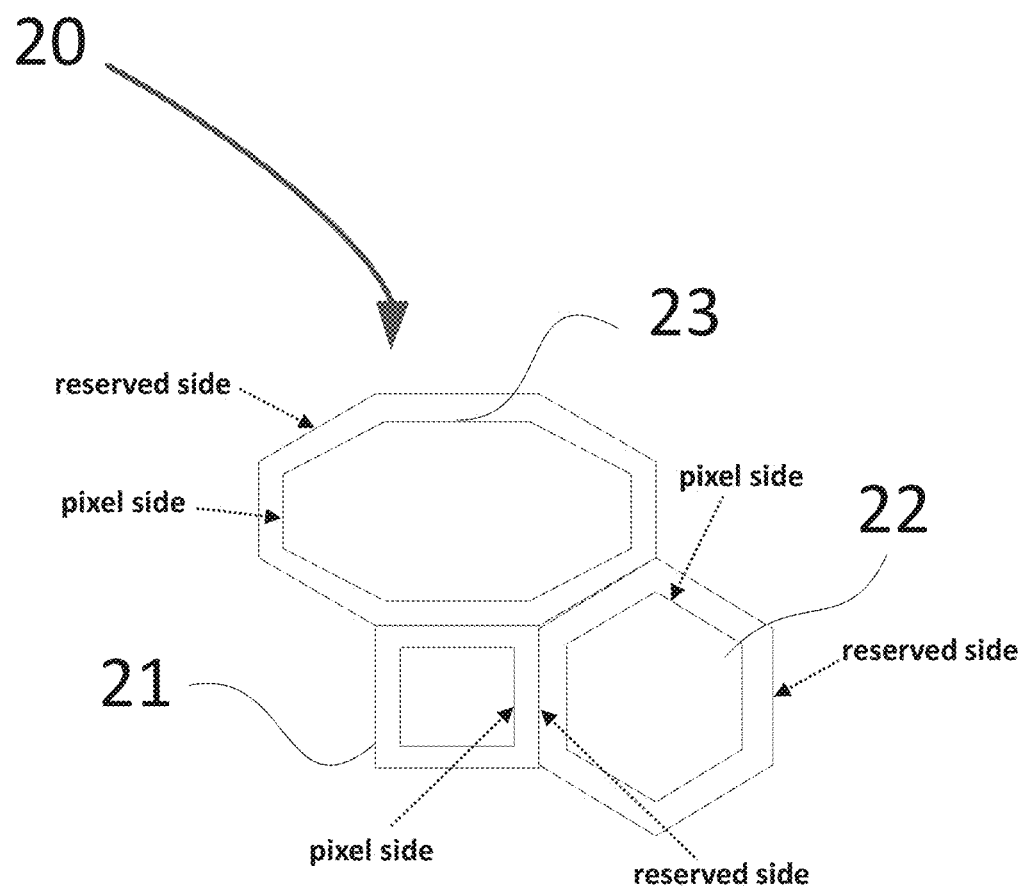
FIG. 7 is a schematic structural diagram of a pixel arrangement structure of display panel, showing that each sub-pixel has a pixel side and a reserved side.
Figure 8:
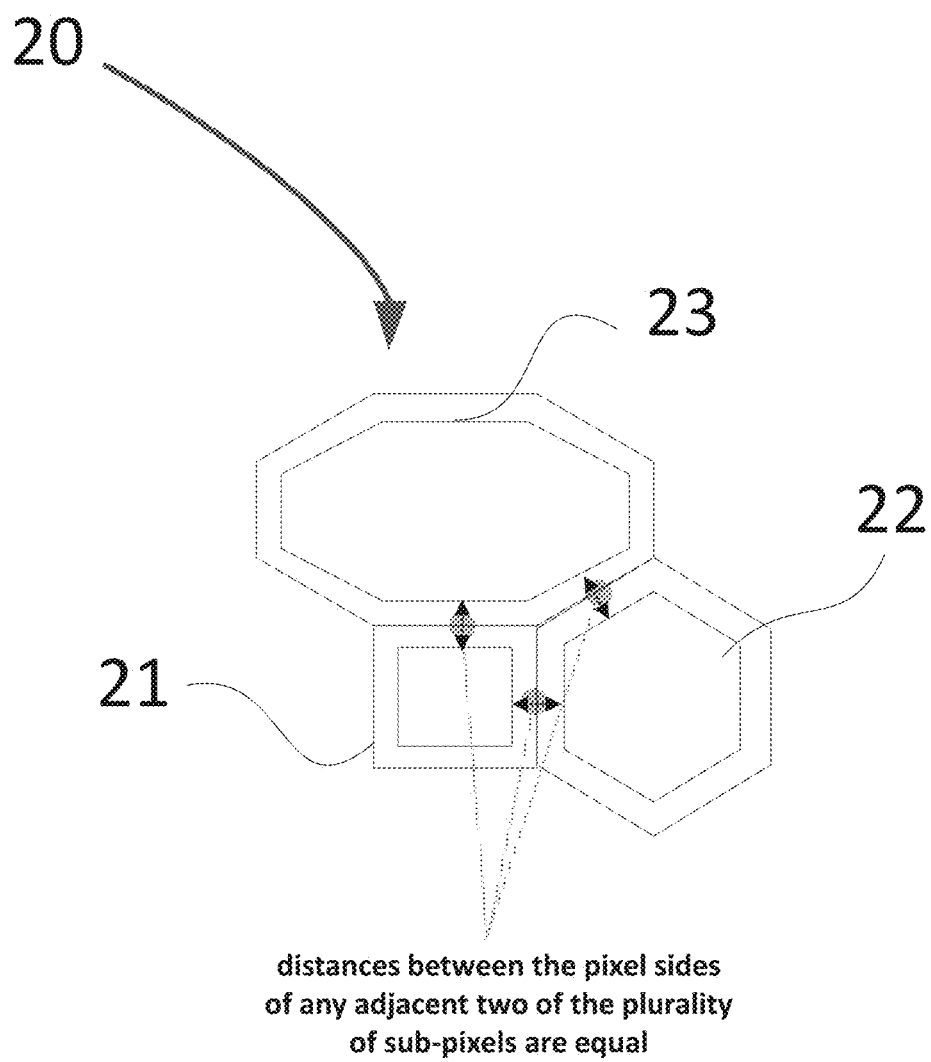
FIG. 8 is a schematic structural diagram of a pixel arrangement structure of display panel, showing that distances between the pixel sides of any adjacent two of the sub-pixels are equal.

FIG. 6 is a schematic structural diagram of a pixel arrangement structure of display panel according to a third embodiment of the present disclosure. As shown in FIG. 6, the pixel arrangement structure of this embodiment includes: a first sub-pixel 21 of a rectangular structure, a second sub-pixel 22 of a hexagonal structure, and a third sub-pixel 23 of an octagonal structure; where the distances between adjacent sides of the first sub-pixel 21, the second sub-pixel 22, and the third sub-pixel 23 are equal; and the first sub-pixel 21, the second sub-pixel 22, and the third sub-pixel 23 that are adjacent to each other constitute a pixel unit combination 20. In the pixel unit combination 20, a distance between a central point 27 of the second sub-pixel and a central point 29 of the third sub-pixel is equal to a distance between a central point of a shortest side among reserved sides of an octagon presented by the third sub-pixel 24 and a central point 28 of the first sub-pixel.

By controlling the distance between the central point 27 of the second sub-pixel and the central point 29 of the third sub-pixel in the pixel unit combination 20 to be equal to the distance between the central point 24 of the shortest side among reserved sides of the octagon presented by the third sub-pixel and the central point 28 of the first sub-pixel, the arrangement of pixels can be made more regular, and display area ratio of the sub-pixels of three different colors can be balanced, and aperture ratio of pixels is improved while ensuring display effect of the display panel.

In this embodiment, through reasonable matching of rectangles, hexagons, and octagons, the aperture area of sub-pixels in a same area is increased.

The third sub-pixel is evaporated through a double-evaporation solution (that is, the number of mask openings is half of the number of sub-pixels of the substrate, and two times evaporations are carried out with displacement to make all the sub-pixels of the substrate are coated with corresponding organic materials during the process). As a result, the strength of FMM (Fine Metal Mask) can be greatly improved, and the difficulty of sub-pixel light emitting material patterns production and the difficulty of FMM stretching can be reduced. Since the pixels are arranged in a regular matrix without misalignment, the stretching accuracy and yield can be improved.

The first sub-pixels, second sub-pixels, and third sub-pixels of a display panel are set to different polygonal structures, such as square structure, regular hexagonal structure, and non-regular octagonal structure, respectively. Since the first sub-pixels, the second sub-pixels, and the third sub-pixels have polygonal structures with different sides, the distances between adjacent sides of the first sub-pixel, the second sub-pixel, and the third sub-pixel may be set to equal in the arrangement, so that all pixels are arranged in a regular matrix, thereby effectively improving the manufacturing accuracy of the sub-pixel light emitting material pattern, and reducing the wrinkles produced by mask during stretching. In addition, the first sub-pixel, the second sub-pixel and the third sub-pixel with different polygonal structures can effectively increase display area of pixels and improve an aperture ratio of pixels.

This embodiment does not limit the sizes of first sub-pixels, second sub-pixels, and third sub-pixels and specific size is determined based on the resolution size that can be achieved by the process. By adjusting length of each side of the first sub-pixels, the second sub-pixels, and the third sub-pixels, the aperture ratio of different colors can be adjusted.

Specifically, it can be verified through experiments that the aperture ratio of the pixel can be increased by the structure in the present disclosure.

First of all, to realize the display, the combination of three primary colors (RGB) is needed, and OLED material realizes the RGB display through thermal evaporation of organic materials, which requires a mask to block. Therefore, the pixel arrangement of the OLED will be restricted by the mask, and the display aperture ratio will also be restricted. However, the photoelectric performance and lifespan characteristics of the OLED device can be effectively improved by increasing in aperture ratio. Therefore, increasing the aperture ratio of RGB pixels through reasonable pixel arrangement design is particularly important in OLED display. This disclosure precisely designed the shape and layout of the three primary colors (RGB) (FIG. 2) for the V-shaped (FIG. 1) pixels, which effectively increased the pixel aperture ratio.

TABLE 1

| Items | | V-shaped structures | Structures provided by the present disclosure |
|---|---|---|---|
| Pixel Size | | | 100 um |
| R:G:B | | | 1:2.1:2.7 |
| PDL(Pixel definition layer)Gap | | | 20 um |
| Percentage (%) | R | 7.02 | 7.47 |
| | G | 14.75 | 15.7 |

TABLE 1-continued

| Items | V-shaped structures | Structures provided by the present disclosure |
|---|---|---|
| B | 18.97 | 20.19 |
| Total opening area | 40.74 | 43.36 |

Note: The V-shaped structure in Table 1 is the structure in FIG. 1.

It can be seen from Table 1 that the structure provided by the present disclosure can significantly improve the aperture ratios of the first sub-pixel, the second sub-pixel, and the third sub-pixel, and the total pixel aperture ratio.

In addition, the embodiments of the present disclosure further provide a display apparatus that uses the pixel arrangement structure of the above-mentioned display panel.

A pixel arrangement structure of display panel of a display apparatus, may include: a first sub-pixel, a second sub-pixel, and a third sub-pixel, where the first sub-pixel, the second sub-pixel, and the third sub-pixel have a polygonal structure with different numbers of sides, and distances between any two of the first sub-pixel, the second sub-pixel and the third sub-pixel that are adjacent to each other are equal.

Optionally, for each of the first sub-pixel, the second sub-pixel and the third sub-pixel, distances from pixel sides to their respective reserved sides are all equal, where the reserved side refers to an outer boundary of a pixel when blocked by a mask structure.

Optionally, the first sub-pixel has a rectangular structure; the second sub-pixel has a hexagonal structure; and the third sub-pixel has an octagonal structure. A length of a shortest side of the octagon presented by the third sub-pixel is smaller than that of a side of the first sub-pixel.

Optionally, a first sub-pixel, a second sub-pixel and a third sub-pixel, which are adjacent to each other, constitute a pixel unit combination, and colors of the first sub-pixel, the second sub-pixel, and the third sub-pixel in the pixel unit combination are different.

Optionally, the colors in the pixel unit combination include: red, blue, and green. There is no gap exists between reserved sides that are adjacent to each other of the first sub-pixel, the second sub-pixel, and the third sub-pixel of the pixel unit combination.

Optionally, a central point of a shortest side among reserved sides of an octagon presented by the third sub-pixel coincides with a position of an intersection of a vertical central axis of the second sub-pixel and a horizontal central axis of the third sub-pixel, in the pixel unit combination.

Optionally, a distance between a central point of the second sub-pixel and a central point of the third sub-pixel is equal to a distance between a central point of a shortest side among reserved sides of an octagon presented by the third sub-pixel and a central point of the first sub-pixel, in the pixel unit combination.

In the display apparatus provided by the present disclosure, the first sub-pixel, the second sub-pixel, and the third sub-pixel in the pixel arrangement structure of the display panel have a polygonal structure with different numbers of sides, therefore the distances between the first sub-pixel, the second sub-pixel and the third sub-pixel, which are adjacent to each other, may be set to equal in the arrangement, so that all pixels are arranged in a regular matrix, thereby effectively improving the manufacturing accuracy of the sub-pixel light emitting material pattern, and reducing the wrinkles produced by mask during stretching. In addition, the first sub-pixel, the second sub-pixel and the third sub-pixel with different polygonal structures can effectively increase display area of pixels and improve an aperture ratio of pixels.

What is claimed is:

1. A pixel arrangement structure of a display panel, comprising:
   a plurality of sub-pixels including a first sub-pixel, a second sub-pixel, and a third sub-pixel, wherein the first sub-pixel, the second sub-pixel and the third sub-pixel have a polygonal structure with different numbers of sides,
   wherein each sub-pixel has a pixel side and a reserved side, the reserved sides of each sub-pixel constitute an outside edge of the sub-pixel, and the pixel sides of each sub-pixel constitute an inner edge of the sub-pixel, and distances between the pixel sides of any adjacent two of the plurality of sub-pixels are equal, and a distance between the pixel side and the corresponding reserved side of each sub-pixel is equal,
   wherein the same type of the sub-pixels in adjacent rows are aligned with each other,
   wherein in a first direction, the third sub-pixels are located in same rows, and in a second direction, the first sub-pixels and the third sub-pixels are alternately arranged in same rows,
   wherein the first direction and the second direction perpendicularly cross each other, and
   wherein a top row of the third sub-pixels are arranged continuously and are aligned with a bottom row of the third sub-pixels that are arranged continuously, the first sub-pixel has a rectangular structure, the second sub-pixel has a hexagonal structure, and the third sub-pixel has an octagonal structure, or
   the first sub-pixel has a square structure, the second sub-pixel has a regular hexagonal structure, and the third sub-pixel has a non-regular octagonal structure.

2. The pixel arrangement structure according to claim 1, wherein a length of a shortest side of the third sub-pixel is smaller than that of the reserved side of the first sub-pixel.

3. The pixel arrangement structure according to claim 1, wherein the first sub-pixel, the second sub-pixel and the third sub-pixel which are adjacent to each other and constitute a pixel unit combination, and the first sub-pixel, the second sub-pixel, and the third sub-pixel in one pixel unit combination have different colors.

4. The pixel arrangement structure according to claim 3, wherein there is no gap between adjacent reserved sides of the sub-pixels in one pixel unit combination.

5. The pixel arrangement structure according to claim 4, wherein lengths of the adjacent reserved sides of the sub-pixels in one pixel unit combination are equal.

6. The pixel arrangement structure according to claim 3, wherein, in one pixel unit combination, a central point of a shortest side among reserved sides of the third sub-pixel coincides with an intersection of a vertical central axis of the second sub-pixel and a horizontal central axis of the third sub-pixel.

7. The pixel arrangement structure according to claim 3, wherein, in one pixel unit combination, a distance between a central point of the second sub-pixel and a central point of the third sub-pixel is equal to a distance between a central point of a shortest side among reserved sides of the third sub-pixel and a central point of the first sub-pixel.

8. The pixel arrangement structure according to claim 3, wherein a central point of a shortest side among reserved sides of the third sub-pixel in the pixel unit combination is located on a central point line of the second sub-pixel.

9. The pixel arrangement structure according to claim 1, wherein the first sub-pixel is a green sub-pixel, the second sub-pixel is a blue sub-pixel, and the third sub-pixel is a red sub-pixel.

10. The pixel arrangement structure according to claim 1, wherein the first sub-pixel is a green sub-pixel, the second sub-pixel is a red sub-pixel, and the third sub-pixel is a blue sub-pixel.

11. The pixel arrangement structure of claim 1, wherein, in the first direction, the third sub-pixels are located in odd rows, and the first sub-pixels and the second sub-pixels are alternately arranged in even rows; and in the second direction, the first sub-pixels and the third sub-pixels are alternately arranged in same rows, central points of the first sub-pixels and the third sub-pixels are arranged along a same line, and central points of the shortest side among reserved sides of the third sub-pixels are located on an imaginary line connecting two centers of the vertically arranged second sub-pixels of the plurality of second sub-pixels.

12. The pixel arrangement structure of claim 1, wherein, in the first direction, the third sub-pixels are located in even rows, and the first sub-pixels and the second sub-pixels are alternately arranged in odd rows; and in the second direction, the first sub-pixels and the third sub-pixels are alternately arranged in same rows, central points of the first sub-pixels and the third sub-pixels are arranged along a same line, and central points of shortest sides among reserved sides of the third sub-pixels are located on an imaginary line connecting two centers of the vertically arranged second sub-pixels of the plurality of second sub-pixels.

13. A display apparatus, comprising: a display panel, the display panel having a pixel arrangement structure comprising:
   a plurality of sub-pixels including a first sub-pixel, a second sub-pixel, and a third sub-pixel, wherein the first sub-pixel, the second sub-pixel and the third sub-pixel have a polygonal structure with different numbers of sides,
   wherein each sub-pixel has a pixel side and a reserved side, the reserved sides of each sub-pixel constitute an outside edge of the sub-pixel, and the pixel sides of each sub-pixel constitute an inner edge of the sub-pixel, and distances between the pixel sides of any adjacent two of the plurality of sub-pixels are equal, and
   a distance between the pixel side and the corresponding reserved side of each sub-pixel is equal,
   wherein the same type of the sub-pixels in adjacent rows are aligned with each other,
   wherein in a first direction, the third sub-pixels are located in same rows, and in a second direction, the first sub-pixels and the third sub-pixels are alternately arranged in same rows,
   wherein the first direction and the second direction perpendicularly cross each other, and
   wherein a top row of the third sub-pixels are arranged continuously and are aligned with a bottom row of the third sub-pixels that are arranged continuously, the first sub-pixel has a rectangular structure, the second sub-pixel has a hexagonal structure, and the third sub-pixel has an octagonal structure.

14. The display apparatus according to claim 13, wherein a length of a shortest side of the third sub-pixel is smaller than that of a side of the first sub-pixel.

15. A display apparatus, comprising: a display panel, the display panel having a pixel arrangement structure comprising:
- a plurality of sub-pixels including a first sub-pixel, a second sub-pixel, and a third sub-pixel, wherein the first sub-pixel, the second sub-pixel and the third sub-pixel have a polygonal structure with different numbers of sides,
- wherein each sub-pixel has a pixel side and a reserved side, the reserved sides of each sub-pixel constitute an outside edge of the sub-pixel, and the pixel sides of each sub-pixel constitute an inner edge of the sub-pixel, and distances between the pixel sides of any adjacent two of the plurality of sub-pixels are equal, and
- a distance between the pixel side and the corresponding reserved side of each sub-pixel is equal,
- wherein the same type of the sub-pixels in adjacent rows are aligned with each other,
- wherein in a first direction, the third sub-pixels are located in same rows, and in a second direction, the first sub-pixels and the third sub-pixels are alternately arranged in same rows,
- wherein the first direction and the second direction perpendicularly cross each other, and
- wherein a top row of the third sub-pixels are arranged continuously and are aligned with a bottom row of the third sub-pixels that are arranged continuously,
- wherein the first sub-pixel has a square structure, the second sub-pixel has a regular hexagonal structure, and the third sub-pixel has a non-regular octagonal structure.

* * * * *